United States Patent [19]

Suzuki

[11] 4,021,751

[45] May 3, 1977

[54] FIELD EFFECT TRANSISTOR AMPLIFIER

[75] Inventor: Tadao Suzuki, Tokyo, Japan

[73] Assignee: Sony Corporation, Tokyo, Japan

[22] Filed: Nov. 3, 1975

[21] Appl. No.: 628,147

[30] Foreign Application Priority Data

Nov. 15, 1974 Japan ............................ 49-131685

[52] U.S. Cl. .................................. 330/35; 330/13; 330/15; 330/17; 330/18; 330/22

[51] Int. Cl.² ......................................... H03F 3/16

[58] Field of Search ................. 330/13, 15, 22, 35, 330/40, 17, 18

[56] References Cited

UNITED STATES PATENTS 3,921,089  11/1975  Tsurushima .................... 330/35 X Primary Examiner—Rudolph V. Rolinec
Assistant Examiner—Lawrence J. Dahl
Attorney, Agent, or Firm—Lewis H. Eslinger; Alvin Sinderbrand

[57] ABSTRACT

A field effect transistor amplifier has a signal input circuit which preferably includes an A-class amplifier, a driving stage having first and second FETs driven in the same phase relation by an input signal applied to their gate electrodes from the signal input circuit, a first voltage source connected to the source electrodes of the first and second FETs, a resistor connected between the drain electrodes of the first and second FETs, an output stage having third and fourth FETs with the gate electrodes of the latter being connected to opposite ends of the resistor so that the voltage across the latter is applied as the DC bias voltage for the FETs of the output stage, a second voltage source connected to the drain electrodes of the third and fourth FETs, and an output terminal connected to the source electrodes of the third and fourth electrodes which are connected to each other. At least the FETs of the output stage are triode characteristic FETs and, if the gain of the A-class amplifier in the signal input circuit is insufficient, the FETs of the driving stage are also triode characteristic FETs.

13 Claims, 8 Drawing Figures

FIELD EFFECT TRANSISTOR AMPLIFIER

BACKGROUND OF THE INVENTION

1. Field of the Invention

This invention relates generally to a transistor amplifier, and more particularly is directed to a transistor amplifier in which field effect transistors are employed as amplifying devices in all of its amplifying stages.

2. Description of the Prior Art

In the well known field effect transistor which will be hereinafter referred to as an FET, the channel in which the drain current $I_D$ flows generally is parallel to its semiconductor substrate or in its lateral direction and the current flowing through this channel is controlled by supplying a reverse biased voltage $V_{GS}$ to its gate. When the drain voltage arrives at a certain value, the current is saturated ($V_{DS}$-$I_D$ characteristics) and so called pentode characteristics are obtained. Since the transmission characteristics ($V_{GS}$-$I_D$ characteristics) are square characteristics, such pentode characteristic FETs have relatively poor distortion characteristics.

FETs with triode characteristics are known in which a current flows perpendicular to the substrate or in its longitudinal direction in a manner similar to that in a bipolar transistor. This type of FET can be made to have a high current utility factor per unit area and provides triode characteristics with a low output resistance. Accordingly, when the above triode characteristic FET is used in a power amplifier for audio use, the quality of the sound obtained is similar to that achieved when a vacuum triode tube is used. Further, when a triode characteristic FET is compared with a vacuum triode tube, the output resistance of the former is much lower than that of the latter, problems due to the heat generated by a heater of a vacuum tube are avoided, and elements with complementary characteristics can be obtained. Thus, if triode characteristic FETs are used in the last stage of an audio power amplifier circuit, a pure complementary OTL circuit can be easily realized. Further, when compared with a bipolar transistor, the triode characteristic FET has a relatively wide safe operation range and easily produces a relatively great output.

A transistor amplifier employing triode characteristic FETs has already been proposed, for example, as disclosed in U.S. patent application Ser. No. 508,836, filed Sept. 24, 1974, now U.S. Pat. No. 3,921,089. However, such previously proposed transistor amplifier has FETs only in its output or final stage, and thus does not fully realize the advantages of employing such elements.

OBJECTS AND SUMMARY OF THE INVENTION

Accordingly, an object of the present invention is to provide an improved field effect transistor (FET) amplifier with FETs employed in all of its amplifying stages.

Another object is to provide an improved field effect transistor amplifier which includes triode characteristic FETs as emplifying devices.

Still another object is to provide a field effect transistor amplifier employing triode characteristic FETs connected in complementary push-pull relationship in at least its output stage, and including a DC bias compensating circuit to compensate for voltage fluctuations in a DC voltage source applied to the output stage.

A further object of the invention is to provide a field effect transistor amplifier employing triode characteristic FETs in at least its output stage, with a bias compensating circuit which compensates for voltage fluctuations of a DC voltage source applied to the output stage, and for any deviation of the pinch-off voltage between individual triode characteristic FETs.

In accordance with an aspect of this invention, a field effect transistor amplifier comprises a signal input circuit; a first voltage source; first and second FETs forming a driving stage and having their respective gate electrodes supplied with an input signal to be amplified and their respective source electrodes connected to the first voltage source; a resistor connected between the drain electrodes of the first and second FETs; a second voltage source; and third and fourth FETs forming an output stage and having their respective gate electrodes connected across the resistor so that the voltage across the latter is applied to the third and fourth FETs as the DC bias voltage therefor, the drain electrodes of the third and fourth FETs being connected to the second voltage source, and the source electrodes thereof being connected to each other and to an output terminal for connection to a load.

In preferred embodiments of the invention, the first and second FETs which constitute the driving stage and the third and fourth FETs which constitute the final amplifying or output stage are each a triode characteristic FET, and the signal input circuit includes an A-class amplifying stage also comprised of FETs for driving the first and second FETs with the same phase relationship.

It is a further feature of the invention to provide additional resistors between the second voltage source and the source electrodes of the first and second FETs by which compensation of the DC bias voltage applied to the gate electrodes of the third and fourth FETs is achieved in respect to voltage fluctuations of the second voltage source and relative deviations of the pinch-off voltages of the third and fourth FETs.

The above, and other objects, features and advantages of the invention, will be apparent from the following detailed description of illustrative embodiments thereof which is to be read in connection with the accompanying drawings.

DESCRIPTION OF THE PREFERRED EMBODIMENTS

Figure 1:
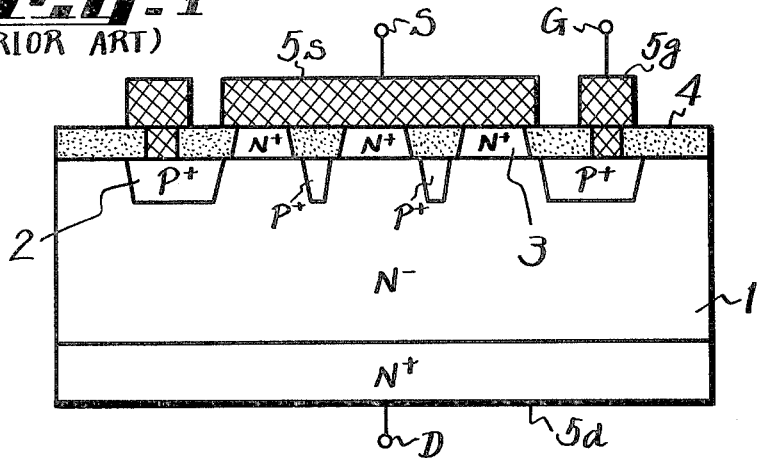
FIG. 1 is a schematic sectional view showing an example of an existing FET with triode characteristics which may be used in a field effect transistor amplifier according to the present invention.

Referring to the drawings in detail, and initially to FIG. 1 thereof, it will be seen that an existing triode characteristic FET formed with an N-channel which is suitable for use in a transistor amplifier according to this invention may comprise a drain region or layer 1 of N-conductivity having a gate region 2 of P+ conductivity embedded, in the form of a mesh, in a surface of region 1. A source region 3 of N+ conductivity is formed, for example, by means of a selective oxidation method, on the surface of region 1 in which the gate region 2 is embedded so as to be constituted by a multitude, for example, well over a thousand, of minute rectangular islands situated within the interstics of the mesh-like gate region 2. An insulating layer 4 of $SiO_2$ is provided for insulating gate region 2 and source region 3, and a common source electrode $5s$ extends over insulating layer 4 for connecting together all of the rectangular islands making up the source region 3. Further, a drain electrode $5d$ of N+ conductivity is provided on the surface of drain region 1 remote from the gate and source regions, and a gate electrode $5g$ extends through insulating layer 4 and is connected to the mesh-like gate region 2. Finally, terminals S,G and D are connected to the source, gate and drain electrodes $5s$, $5g$ and $5d$ of the FET.

Figure 2:
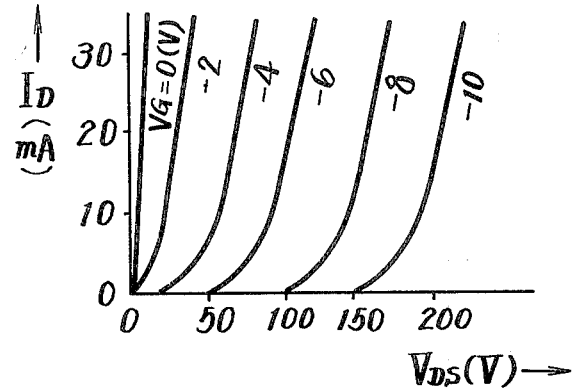
FIG. 2 is a graph illustrating typical output characteistics of an FET of the type shown in FIG. 1.

It will be apparent that, in an FET as described above, the drain region 1 and the source region 3 face each other at a plane extending in the longitudinal direction with the gate region 2 being located therebetween in the form of a mesh so that there is a small ratio $L/h$ between the channel length L and the distance $h$ between adjacent parts of the gate region 2. By reason of the foregoing, the illustrated FET has a very small output resistance or impedance and the drain current $I_D$ thereof does not become saturated in response to increasing of the voltage $V_{DS}$ between the drain and source. As shown on FIG. 2, by way of example, in which the abscissa indicates drain-source voltage $V_{DS}$ in volts (V) and the ordinate indicates drain current $I_D$ in milli-ampere (mA), with gate voltage $V_G$ in volts (V) being used as a parameter, the drain voltage-drain current characteristic curves of a field effect transistor of the type shown on FIG. 1 are similar to those of a triode so that the illustrated field effect transistor can be said to have triode characteristics. More particularly, it will be seen that the drain voltage-drain current characteristic curves of FIG. 2, being similar to those of a triode, are straight for substantial portions of their lengths with such straight portions being steeply inclined and substantially parallel, to indicate a low output impedance and the capacity to provide a large output of excellent linearity and relatively low distortion. As an example, a triode characteristic FET of the type shown on FIG. 1 has been produced with the following characteristics: voltage amplification factor $\mu=4$; output resistance $r_D=16\Omega$; and mutual conductance $gm=250m\ \upsilon$ for the condition $V_{DS}=20V$ and $I_D=1A$. In respect to the transmission characteristics of such an FET, that is, the $V_{GS}-I_D$ characteristics thereof, if a suitable load is selected, the mutual conductance gm becomes substantially constant and, hence, linear characteristics are obtained. Although the illustrated triode characteristic FET exhibits square characteristics, such FETs, when employed in a push-pull amplifying stage, make possible an amplification of superior linearity and reduced distortion.

Further, as compared with a bipolar transistor, the triode characteristic FET is free from current concentrations, is relatively less susceptible to damage by second and following yields, has a negative temperature characteristic, produces less heat during operation and has a rapid transient response, whereby the triode characteristic FET is suitable for use a power amplification semiconductor element.

As previously mentioned, the illustrated triode characteristic FET is of the N-channel type. However, it will be apparent that a similar P-channel FET may be easily produced, for example, by providing the drain, gate and source regions 1, 2 and 3 with $P^-, N^+$ and $P^+$ conductivities, respectively. Therefore, triode characteristic FETs of the described type may be easily provided for complementary connections.

Figure 3:
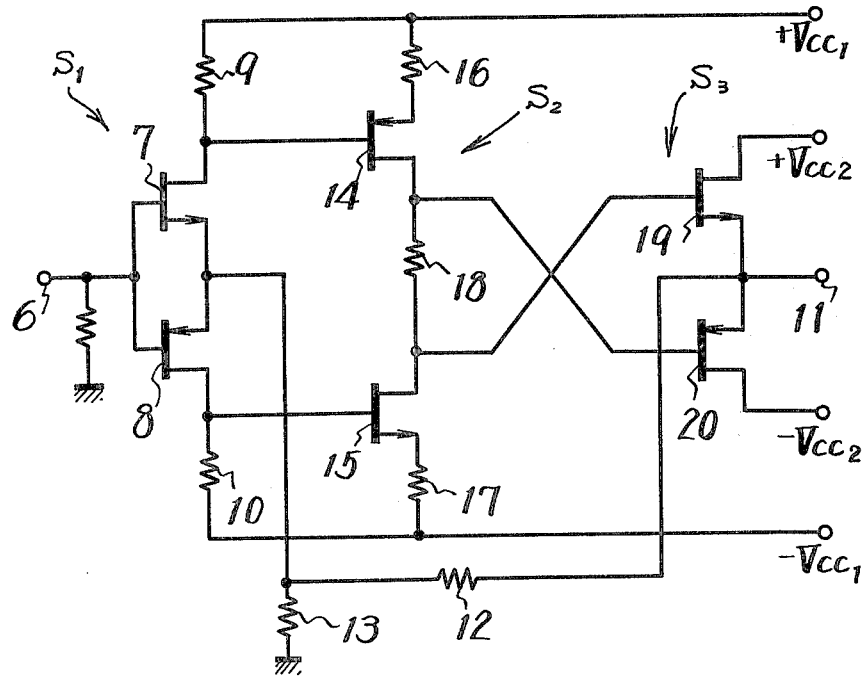
FIG. 3 is a circuit diagram showing a transistor amplifier according to one embodiment of the present invention.

Referring now to FIG. 3, it will be seen that a transistor amplifier according to an embodiment of this invention generally comprises a signal input circuit $S_1$ which preferably includes an A-class amplifier, a driving stage $S_2$ and an output or final amplifying stage $S_3$, with all of the stages employing FETs and with the FETs of at least the output stage $S_3$, and preferably also of the driving stage $S_2$, being triode characteristic FETs, for example, of the type described above with reference to FIG. 1.

More particularly, in the embodiment of FIG. 3, the signal input circuit $S_1$ is seen to have an input terminal 6 for receiving a signal to be amplified, an N-channel FET 7 and a P-channel FET 8. The gate electrodes of FETs 7 and 8 are connected to input terminal 6, the drain electrode of FET 7 is connected through a load resistor 9 to the positive terminal $+V_{cc1}$ of a first voltage source, and the drain electrode of FET 8 is connected through a load resistor 10 to the negative terminal $-V_{cc1}$ of such first voltage source. The source electrodes of FETs 7 and 8 are connected together to the ground through a resistor 13. Thus, FETs 7 and 8 form an A-class first amplifying stage. To the connection point between the source electrodes of FETs 7 and 8, a negative feedback is applied from an output terminal 11 through a resistor 12. At the drain electrodes of FETs 7 and 8, there appear signal voltages which are of the same phase, and which are applied to the gate electrodes of P-channel and N-channel FETs 14 and 15, respectively, included in the driving stage $S_2$. The source electrode of FET 14 is connected through a resistor 16 to the voltage source terminal $+V_{cc1}$, the source electrode of FET 15 is connected through a resistor 17 to the voltage source terminal $-V_{cc1}$ and the drain electrodes of FETs 14 and 15 are connected with each other through a resistor 18. These FETs 14 and 15 from the A-class push-pull driving stage, and the voltage drop across the resistor 18 is used as the gate bias for N-channel and P-channel FETs 19 and 20 of the output or final amplifying stage $S_3$, as will be hereinafter described in detail. The drain electrodes of FETs 19 and 20 are connected to terminals $+V_{cc2}$ and $-V_{cc2}$, respectively, of a second voltage source, and the source electrodes of FETs 19 and 20 are connected to each other with the output terminal 11 being connected to a connection point therebetween. The FETs 19 and 20 operate as either an AB- or B-class amplifier. The gate electrodes of FETs 19 and 20 are connected to the opposite ends of resistor 18 in such a manner that a negative gate bias, which corresponds to the pinch-off voltage of FET 19, is applied to FET 19, while a positive gate bias, which corresponds to the pinch-off voltage of FET 20, is applied to the latter.

As previously noted, the FETs 14,15,19 and 20 are preferably all triode characteristic FETs. However, when the gain of the A-class amplifier included in signal input circuit $S_1$ is sufficient, at least the FETs 14 and 15, and even possibly the FETs 19 and 20, may be conventional or pentode characteristic FETs.

In any case, in the circuit arrangement as described above, the voltage drop cross resistor 18 can be made constant regardless of the input signal and, therefore, can be used as the gate bias voltage for the FETs 19 and 20.

Figure 4:
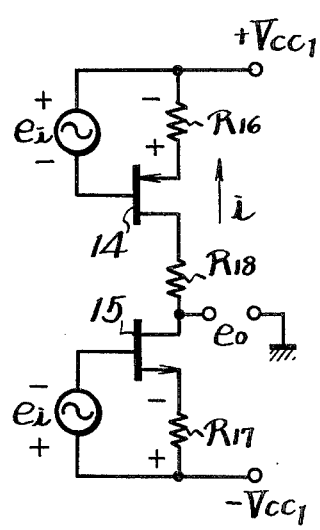
FIGS. 4 and 5 are equivalent circuits to a portion of the circuit shown on FIG. 3.

In order to demonstrate that the voltage drop across resistor 18 can be made constant, reference will now be made to FIG. 4 which shows the equivalent of the stage $S_2$ in FIG. 3, and in which $R_{16}, R_{17}$ and $R_{18}$ correspond to the resistance values of resistors 16,17 and 18, respectively, and voltage sources $e_1$ correspond to the output voltages obtained at the drain electrodes of FETs 7 and 8, respectively, of the earlier stage. The voltage sources $e_i$ have the same phase and a signal current $i$ is made to flow thereby in the direction indicated by the arrow on FIG. 4 to cause voltage drops across the resistors $R_{16}$ and $R_{17}$ with the polarities shown on FIG. 4. Further, if in FIG. 4 the drain output voltage of FET 15 is indicated by $e_o$, the circuit of FIG. 4 can be represented as shown on FIG. 5 in which the FETs 14 and 15 are equivalently represented as respective voltage souces and output resistances. More particularly, on FIG. 5, $\mu_1$ and $\rho_1$ respectively indicate the voltage amplification factor and output resistance of FET 14, and $\mu_2$ and $\rho_2$ respecively indicate the voltage amplification factor and output resistance of FET 15. The voltage sources representing the FETs 14 and 15 on FIG. 5 become $[-\mu_1(-e_i-R_{16}i)]$ and $[+\mu_2(e_i-R_{17}i)]$, respectively. These are determined by the direction of the signal current $i$ in respect to the FETs 14 and 15 and the polarity of the input voltage source $e_i$.

Figure 5:
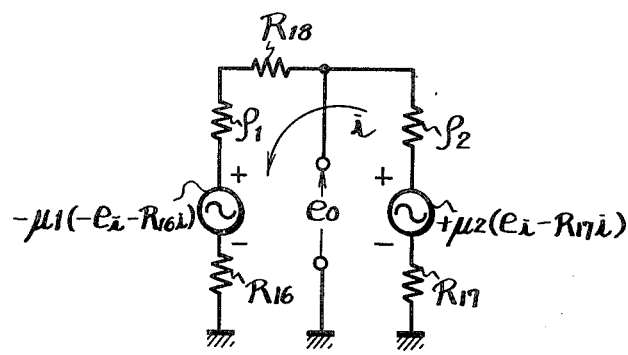

In the equivalent circuit shown on FIG. 5, the signal current $i$ may be expressed as follows:

$$i = \frac{\mu_2(e_i - R_{17}i) + \mu_1(-e_i - R_{16}i)}{\rho_1 + \rho_2 + R_{16} + R_{17} + R_{18}} \quad (1)$$

From the above equation (1), the following equation is obtained, $$i = \frac{\mu_2 e_i - \mu_1 e_i}{\rho_1 + \rho_2 + R_{16}(1 + \mu_1) + R_{17}(1 + \mu_2) + R_{18}} \quad (2)$$

It will be apparent that, when $\mu_1 = \mu_2$, that is, when the FETs 14 and 15 have equal voltage amplification factors, $i$ becomes zero in equation (2). Therefore, it will be understood that no current $i$ having an AC component flows through the resistor 18 as a result of the input signal voltages $e_i$ applied to the gate electrodes of FETs 14 and 15. By reason of the foregoing, the DC component of the voltage drop across resistor 18 is constant regardless of the signal voltage and, therefore, can be used as the gate bias voltage for the FETs 19 and 20 of the last or output stage. Further, if $R_{16} = R_{17}$ and $\rho_1 = \rho_2$ in the equivalent circuit shown on FIG. 5, the output voltage $e_o$ becomes $\mu e_i$ ($e_o = \mu e_i$) due to $i=o$. Accordingly, if the previously described triode characteristic FET is employed for each of the FETs 14 and 15, its greatest gain can be obtained.

In the above described embodiment of the invention, the FETs 14 and 15 used to produce across the resistor 18 the gate bias voltage for the FETs 19 and 20 of the output stage have complementary characteristics and, thus, the FETs 14 and 15 are connected in a push-pull manner, so that the resulting circuit has superior distortion characteristics and a high gain.

Figure 6:
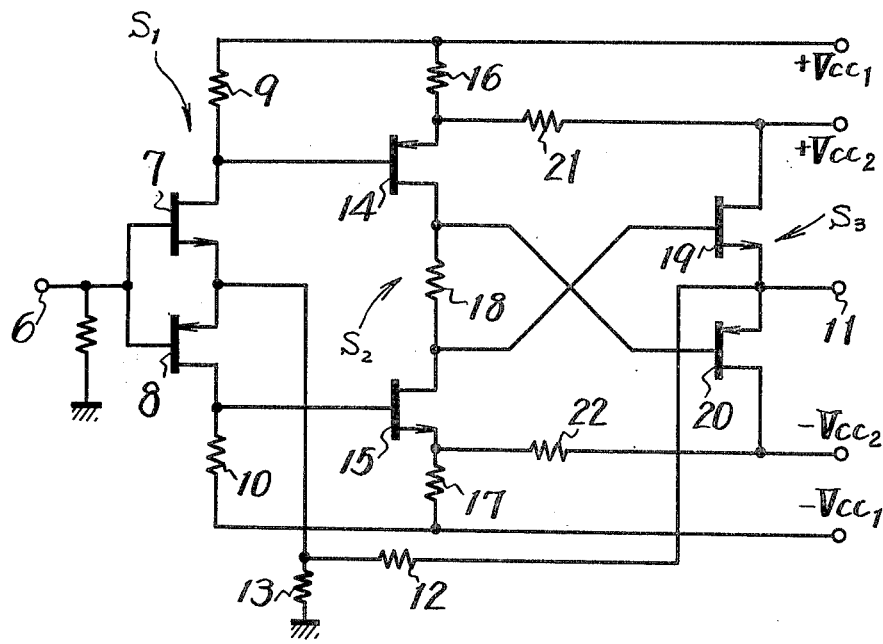
FIG. 6 is a circuit diagram showing another embodiment of the invention which is provided with a DC bias compensating circuit for the triode characteristic FETs of the output stage.

FIG. 6 shows another embodiment of the present invention in which the elements corresponding to those described above with reference to FIG. 3 are identified by the same reference numerals. In the amplifier of FIG. 6, the source electrode of FET 14 is connected through a resistor 21 to the positive voltage source terminal $+V_{cc2}$ and source electrode of FET 15 is connected through a resistor 22 to the negative voltage source terminal $-V_{cc2}$ to supply the fluctuation or variation of the second voltage source thereto and hence to stabilize the bias voltage against the fluctuation or variation of such voltage source. If the values of resistors 21 and 22 are suitably selected, as hereinafter described, distortion as a result of variation of the operating point of FETs 19 and 20 may be avoided.

In the circuit of FIG. 6, the current $i'$ flowing through resistor 18 as a result of voltage fluctuations $\Delta V_1$ and $\Delta V_2$ at the positive and negative voltage source terminals $+V_{cc2}$ and $-V_{cc2}$, respectively, which voltage fluctuations or ripple voltages have reverse phases, may be expressed similarly to equation (2) as follows:

$$i' = \frac{\mu_1 \Delta V_1' + \mu_2 \Delta V_2'}{\rho_1 + \rho_2 + R_{16}'(1 + \mu_1) + R_{17}'(1 + \mu_2) + R_{18}} \quad (3)$$

in which $$R_{16}' = \frac{1}{\frac{1}{R_{16}} + \frac{1}{R_{21}}}$$

$$R_{17}' = \frac{1}{\frac{1}{R_{17}} + \frac{1}{R_{22}}}$$

$$\Delta V_1' = \frac{R_{16}}{R_{16} + R_{21}} \Delta V_1$$

$$\Delta V_2' = \frac{R_{17}}{R_{17} + R_{22}} \Delta V_2$$

and further in which $\mu_1, \mu_2, \rho_1, \rho_2, R_{16}, R_{17}$ and $R_{18}$ have the meanings defined above and $R_{21}$ and $R_{22}$ are the resistance values of the resistors 21 and 22, respectively.

If it is assumed that $\mu_1 = \mu_2 \gg 1$, that $R_{16}' = R_{17}'$, that $\Delta V_1' = \Delta V_2'$, and that each of $\rho_1, \rho_2$ and $R_{18} < R_{16}' \mu_1$, then equation (3) can be written as follows:

$$i' \approx \frac{\Delta V'}{R_{16}'} \quad (4)$$

In view of equation (4), the fluctuation $\Delta V_{18}$ of the voltage drop across resistor 18 resulting from the voltage fluctuations $\Delta V_1$ and $\Delta V_2$ at terminals $+V_{cc2}$ and $-V_{cc2}$ can be expressed as follows:

$$\Delta V_{18} \approx \frac{R_{18}}{R_{16}'} \cdot \Delta V_1' \quad (5)$$

In order to stabilize the DC bias voltage applied to FET 19 in respect to the voltage fluctuation $\Delta V_1$ at voltage source terminal $+V_{cc2}$, the fluctuation $\Delta V_{18}$ of the voltage drop across resistor 18 has to satisfy the following equation:

$$\Delta_{18} \approx \frac{1}{\mu_3} \Delta V_1 \quad (6)$$

in which $\mu_3$ is the voltage amplification factor of FET 19. Substituting equation (5) in equation (6) results in:

$$1/\mu_3 \Delta V_1 \approx \frac{R_{18}}{R_{16}'} \cdot \Delta V_1' \quad (7)$$

Substituting the above defined meanings for $R_{16}'$ and $\Delta V_1'$ in equation (7) results in the following:

$$\frac{1}{\mu_3} \cdot \Delta V_1 \approx \frac{R_{18}}{\left[\frac{1}{\frac{1}{R_{16}} + \frac{1}{R_{21}}}\right]} \cdot \frac{R_{16}}{R_{16} + R_{21}} \cdot \Delta V_1$$

or $$\frac{1}{\mu_3} \approx \left[\frac{1}{R_{16}} + \frac{1}{R_{21}}\right] \cdot \frac{R_{18} \cdot R_{16}}{R_{16} + R_{21}}$$

or $$\frac{1}{\mu_3} \approx \frac{R_{21} + R_{16}}{R_{16} \cdot R_{21}} \cdot \frac{R_{18} \cdot R_{16}}{R_{16} + R_{21}}$$

which gives $$\frac{1}{\mu_3} \approx \frac{R_{18}}{R_{21}} \quad (8)$$

in order to ensure that the DC bias voltage of FET 19 will be stabilized against variations or fluctuations in the voltage at the voltage source terminal $+V_{cc2}$.

Similarly, the DC bias voltage of FET 20 is stabilized against variations or fluctuations in the voltage at voltage source terminal $-V_{cc2}$ when the resistance values $R_{18}$ and $R_{22}$ are selected to satisfy the below equation:

$$\frac{1}{\mu_4} \approx \frac{R_{18}}{R_{22}} \quad (9)$$

in which $\mu_4$ is the voltage amplification factor of FET 20 which may be equal to $\mu_3$.

If the pinch-off voltages $V_p$ of FETs 19 and 20 are equal, the voltage drop across the resistor 18 becomes about $2V_p$. At this time, the current I flowing through resistor 18 and FETs 14 nd 15 is determined by the following equation:

$$R_{18} = \frac{2V_p}{I} \quad (10)$$

In general, the product of the pinch-off voltage and the voltage amplification factor of an FET is a constant $k$, that is:

$$V_p \cdot \mu = k$$

or $$V_p = \frac{k}{\mu} \quad (11)$$

Substituting equation (10) in equation (8) provides:

$$\frac{1}{\mu_3} \approx \frac{2V_p}{I} \cdot \frac{1}{R_{21}} \quad (12)$$

Substituting equation (11) in equation (12) provides:

$$\frac{1}{\mu_3} \approx \frac{2k}{I \cdot \mu_3} \cdot \frac{1}{R_{21}}$$

or $$\frac{I}{2k} \approx \frac{1}{R_{21}} \quad (13)$$

Similarly, the following relationship can be derived:

$$\frac{I}{2k} \approx \frac{1}{R_{22}} \quad (14)$$

If the values of $R_{21}$ and $R_{22}$ are selected to satisfy equations (13) and (14) in accordance with the characteristics of FETs 19 and 20 represented by the constant $k$, the predetermined bias voltage of about $2V_p$ can be applied to the FETs 19 and 20 even when the pinch-off voltages of such FETs are different. Of course, when the FETs 19 and 20 have different pinch-off voltages, the values $2k$ in equations (13) and (14) become $(k_3+k_4)$, with $K_3$ and $K_4$ being the respective constants for FETs 19 and 20.

Figure 7:
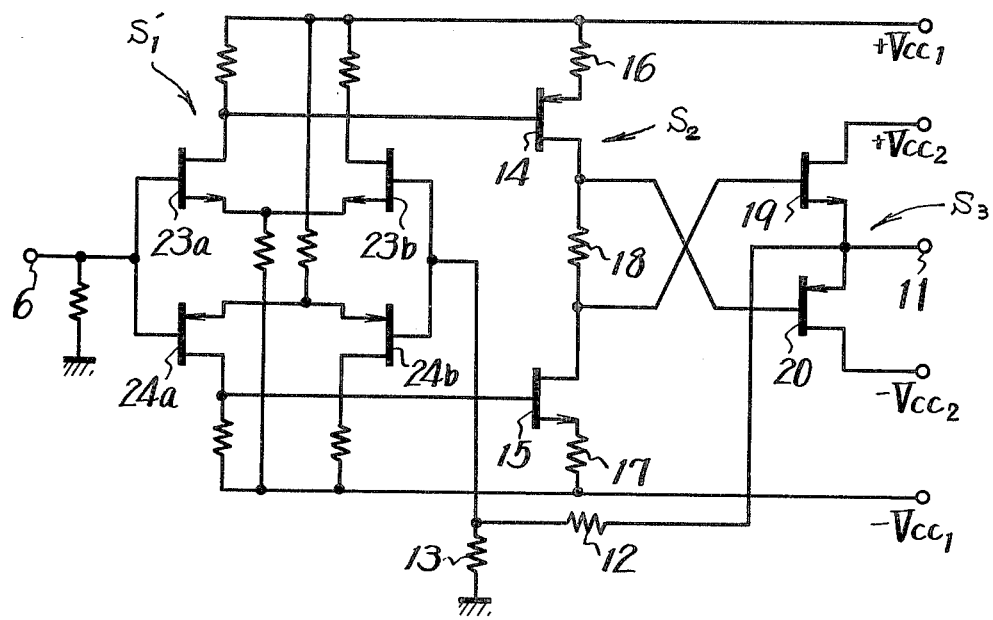
FIGS. 7 and 8 are circuit diagrams respectively showing transistor amplifiers according to additional embodiments of the present invention.

Referring now to FIG. 7, in which elements corresponding to those described above with reference to FIG. 3 are identified by the same reference numerals, it will be seen that, in the embodiment of FIG. 7, the signal input circuit $S_1'$ includes an A-class amplifier comprised of a differential amplifier consisting of N-channel FETs 23a and 23b and a differential amplifier consisting of P-channel FETs 24a and 24b in place of FETs 7 and 8 in FIG. 3, whereby to further stabilize the first or input stage and also to improve the DC gain thereof. The driving stage $S_2$ comprised of FETs 14 and 15 and the output stage $S_3$ comprised of FETs 19 and 20 are shown on FIG. 7 to be similar in construction and operation to the corresponding stages on FIG. 3. Further, the embodiment of FIG. 7 may be modified for stabilization of the bias applied to FETs 19 and 20 in the same manner as has been described above with reference to FIG. 6.

Figure 8:
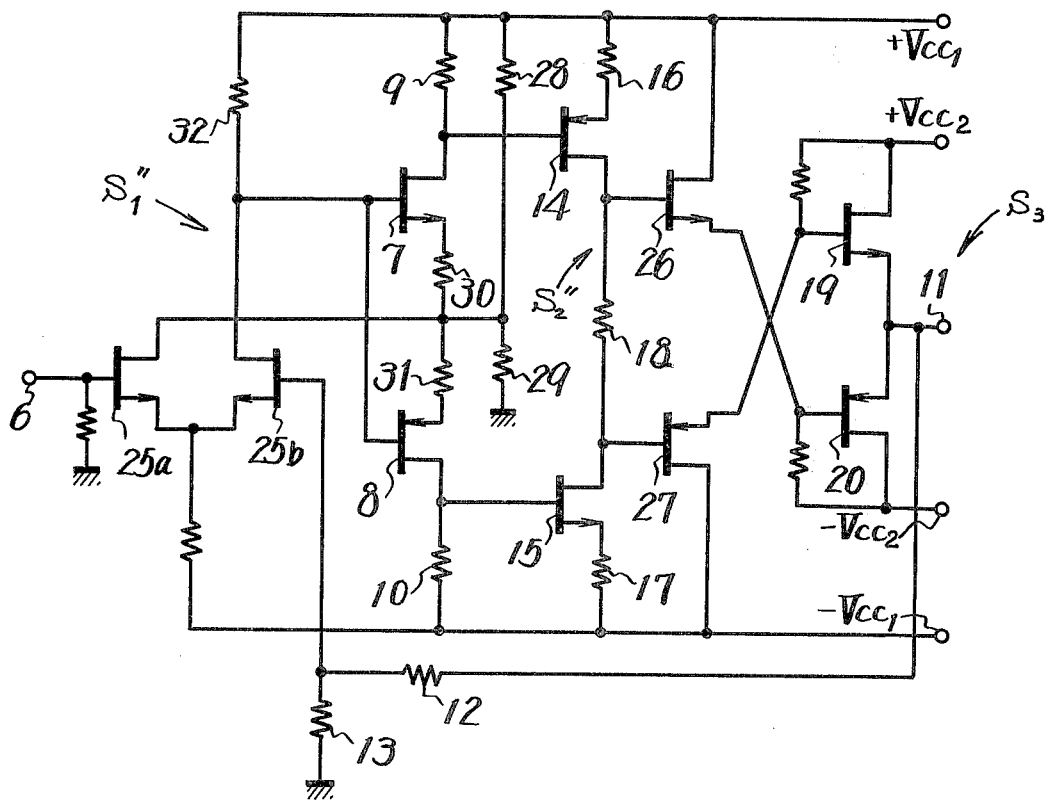

Referring now to FIG. 8, in which elements corresponding to those described above with reference to FIG. 3 are again identified by the same reference numerals, it will be seen that, in the embodiment of FIG. 8, the signal input circuit $S_1''$ further includes a differential amplifier consisting of N-channel FETs 25a and 25b and arranged to precede the A-class amplifier constituted by FETs 7 and 8. Further, in the embodiment of FIG. 8, an N-channel FET 26 of source-follower configuration is provided between driving stage $S_2''$ and output stage $S_3$ for driving FET 20 of the latter, and a P-channel FET 27 of source-follower configuration is similarly provided for driving FET 19 of the output stage.

With the circuit arrangement of FIG. 8, a sufficient open loop gain is obtained and at the same time the input capacity of FETs 19 and 20 is impedance-converted by the FETs 26 and 27, so that the high band characteristics of the amplifier can be improved.

Further, in FIG. 8, resistors 28 and 29 are shown connected in series between the voltage source terminal $+V_{cc1}$ and the ground to form a breeder resistor which determines the drain voltages of FETs 25a and 25b. More particularly, the connection point between resistors 28 and 29 is shown to be connected to the drain electrode of FET 25a and also to the source electrodes of FETs 7 and 8 through resistors 30 and 31, respectively. The potential at the connection point between the resistors 30 and 31 is set to be the same as that at the connection point between the gate electrodes of FETs 7 and 8 by suitable selection of the resistors 28 and 29, and the connection point between the gate electrodes of FETs 7 and 8 is connected to the drain electrode of FET 25b. Thus, the drain voltages of FETs 25a and 25b are made equal to each other.

A load resistor 32 is provided for the FET 25b and given a high resistance value for providing the first stage with a high gain. Thus, it is possible to increase the open loop gain. Further, a capacitor (not shown) may be connected in parallel with the resistor 29.

A bias stabilizing arrangement similar to that shown on FIG. 6 may also be used in the embodiment of FIG. 8.

In the embodiment of FIG. 8, if a capacitor (not shown) is connected in parallel to the resistor 18, asymmetry of the driving condition caused by any difference between the input capacities of FETs 26 and 27 can be cancelled and hence the distortion factor for the high frequency band is improved. Further, if a capacitor (not shown) is connected between the gate electrodes of FETs 19 and 20, the driving capability of FETs 19 and 20 for the input capacity can be improved and good high band characteristics are obtained.

Although several preferred embodiments of the invention, and modifications thereof, have been specifically described herein with reference to the accompanying drawings, it is to be understood that the invention is not limited to those precise embodiments and modifications, and that further modifications and changes may be effected therein by one skilled in the art without departing from the scope or spirit of the invention as defined in the appended claims.

What is claimed is:

1. A field effect transistor amplifier comprising first DC voltage source means, first and second field effect transistors each having gate, source and drain electrodes, a resistor connected between the drain electrodes of said first and second field effect transistors, means connecting the source electrodes of said first and second field effect transistors to said first DC voltage source means, input circuit means for applying to the gate electrodes of said first and second field effect transistors respective signals of the same polarity corresponding to an input signal to be amplified, second DC voltage source means, third and fourth field effect transistors each having gate, source and drain electrodes, the drain electrodes of said third and fourth field effect transistors being connected to said second DC voltage source means, the source electrodes of said third and fourth field effect transistors being connected to each other, an output terminal connected to the connected together source electrodes of said third and fourth field effect transistors, and means for applying the voltage across said resistor as a DC bias voltage to the gate electrodes of said third and fourth field effect transistors.

2. A field effect transistor amplifier according to claim 1; in which at least each of said third and fourth field effect transistors is a triode characteristic field effect transistor.

3. A field effect transistor amplifier according to claim 1; in which each of said first, second, third and fourth field effect transistors is a triode characteristic field effect transistor.

4. A field effect transistor amplifier according to claim 1; in which said first and second field effect transistors have complementary characteristics, and said third and fourth field effect transistors have complementary characteristics.

5. A field effect transistor amplifier according to claim 1; further comprising first and second voltage injecting means connecting said second DC voltage source means to said source electrodes of said first and second field effect transistors for applying a ripple voltage in said second DC voltage source means to said source electrode of said first and second field effect transistors, respectively, so that said voltage across said resistor is stabilized in respect to voltage fluctuations occurring in said second DC voltage source means.

6. A field effect transistor amplifier according to claim 5; in which said means connecting said source electrodes of said first and second field effect transistors to said first DC voltage source means are constituted by second and third resistors, respectively, and said first and second voltage injecting means respectively include a fourth resistor and a fifth resistor connected between said second DC voltage source means and said source electrodes of said first and second field effect transistors, respectively.

7. A field effect transistor amplifier according to claim 6; in which the first mentioned resistor and said fourth and fifth resistors have resistance values $R_1$, $R_4$ and $R_5$, respectively, which satisfy the following equations:

$$\frac{R_1}{R_4} \approx \frac{1}{\mu_3} \text{ and } \frac{R_1}{R_5} \approx \frac{1}{\mu_4}$$

in which $\mu_3$ and $\mu_4$ are the voltage amplification factors of said third and fourth field effect transistors, respectively.

8. A field effect transistor amplifier according to claim 6; in which said resistance values of said fourth and fifth resistors further satisfy the following equations:

$$\frac{1}{R_4} \approx \frac{I}{2k} \text{ and } \frac{1}{R_5} \approx \frac{I}{2k}$$

in which I is the current flowing through said first resistor and said first and second field effect transistors for the pinch-off voltages of said third and fourth field effect transistors, and k is a constant for said third and fourth field effect transistors determined by the product of the respective pinch-off voltage and voltage amplification factor.

9. A field effect transistor amplifier according to claim 1; in which each of said first, second, third and fourth field effect transistors is a triode characteristic field effect transistor; and in which said input circuit means includes an A-class amplifying stage for driving said first and second field effect transistors.

10. A field effect transistor amplifier according to claim 9; in which said A-class amplifying stage of the input circuit means includes fifth and sixth field effect transistors connected in complementary push-pull relationship to said first DC voltage source means for driving said first and second field effect transistors with the same phase relationship.

11. A field effect transistor amplifier according to claim 10; further comprising negative voltage feedback means between said connected together source electrodes of said third and fourth field effect transistors and said A-class amplifying stage of the input circuit means.

12. A field effect transistor amplifier according to claim 9; in which said A-class amplifying stage of the input circuit means includes a pair of differential amplifiers.

13. A field effect transistor amplifier according to claim 9; in which said input circuit means further includes a differential amplifier preceding said A-class amplifying stage.

* * * * *